United States Patent [19]

Lougheed et al.

[11] Patent Number: 4,510,616
[45] Date of Patent: * Apr. 9, 1985

[54] DESIGN RULE CHECKING USING SERIAL NEIGHBORHOOD PROCESSORS

[75] Inventors: Robert M. Lougheed; Trevor N. Mudge, both of Ann Arbor, Mich.

[73] Assignee: The Environmental Research Institute of Michigan, Ann Arbor, Mich.

[ * ] Notice: The portion of the term of this patent subsequent to Apr. 3, 2001 has been disclaimed.

[21] Appl. No.: 577,003

[22] Filed: Feb. 6, 1984

Related U.S. Application Data

[62] Division of Ser. No. 340,609, Jan. 19, 1981, Pat. No. 4,441,207.

[51] Int. Cl.³ .............................................. G06K 9/36
[52] U.S. Cl. .................................... 382/8; 364/490; 364/560; 382/25; 382/27; 382/41; 382/49
[58] Field of Search .............................. 356/379–387, 356/394; 358/101, 106, 107; 364/488–491, 560–564, 715, 725; 382/8, 19, 25, 27, 41, 49

[56] References Cited

U.S. PATENT DOCUMENTS

| | | | |
|---|---|---|---|
| 4,167,728 | 9/1979 | Sternberg | 382/49 |
| 4,223,387 | 9/1980 | Danielsson et al. | 382/8 |
| 4,242,662 | 12/1980 | Tsujiyama et al. | 382/8 |
| 4,300,122 | 11/1981 | McMahon | 382/8 |
| 4,301,443 | 11/1981 | Sternberg et al. | 382/49 |
| 4,345,312 | 8/1982 | Yasuye et al. | 382/8 |
| 4,420,768 | 12/1983 | Grosskopf | 358/107 |
| 4,443,855 | 4/1984 | Bishop et al. | 358/107 |

OTHER PUBLICATIONS

Baker et al., "Tools for Verifying Integrated Circuit Designs", *Lamda*, Fourth Quarter, 1980.
Baker, "Artwork Analysis Tools for ULSI Circuits", (M.S. Thesis) MIT, 1980.
Seiler, "Special Purpose Hardware for Design Rule Checking", Private Communication, in Preparation for 2nd Caltech Conference on VLSI, Jan. 10–21, 1981.
Baird, "Fast Algorithms for LSI Artwork Analysis", *Journal of Design Automation and Fault Tolerant Computing*, vol. 2, No. 2 May 1978.

*Primary Examiner*—Leo H. Boudreau
*Attorney, Agent, or Firm*—Krass & Young

[57] ABSTRACT

A pipeline of programmable serial neighborhood stages is used to automatically check for adherence to a set of predetermined geometrical constraints or design rules used in the fabrication of electronic components such as integrated circuit devices. In a disclosed embodiment, bit-map representations of several IC masks are superimposed in one composite image matrix for processing in the pipeline. Advantages in processing speed, especially for design rule checking requiring data from more than one mask, are obtained since all necessary data is available to the stages in the pipeline.

3 Claims, 10 Drawing Figures

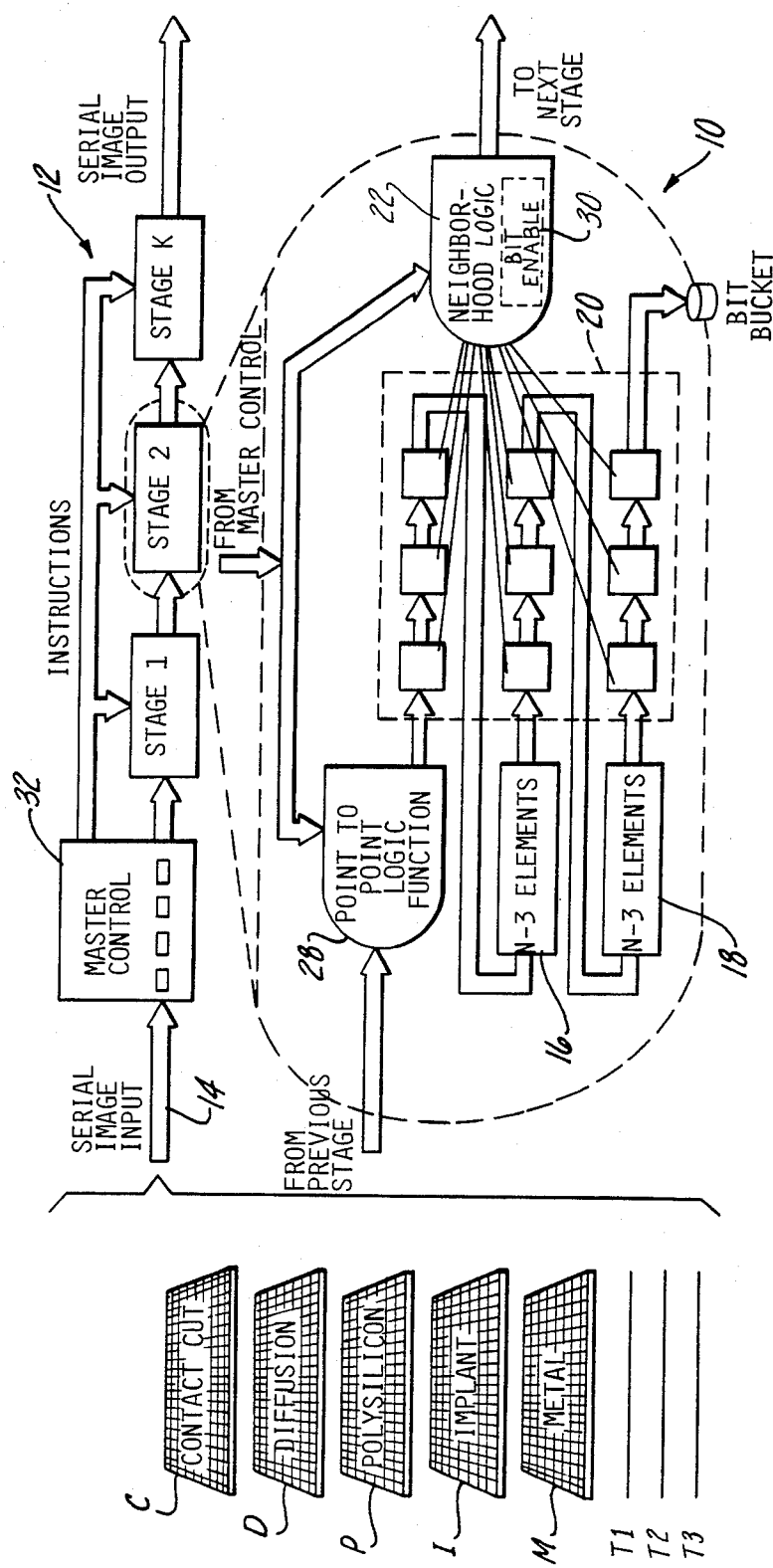

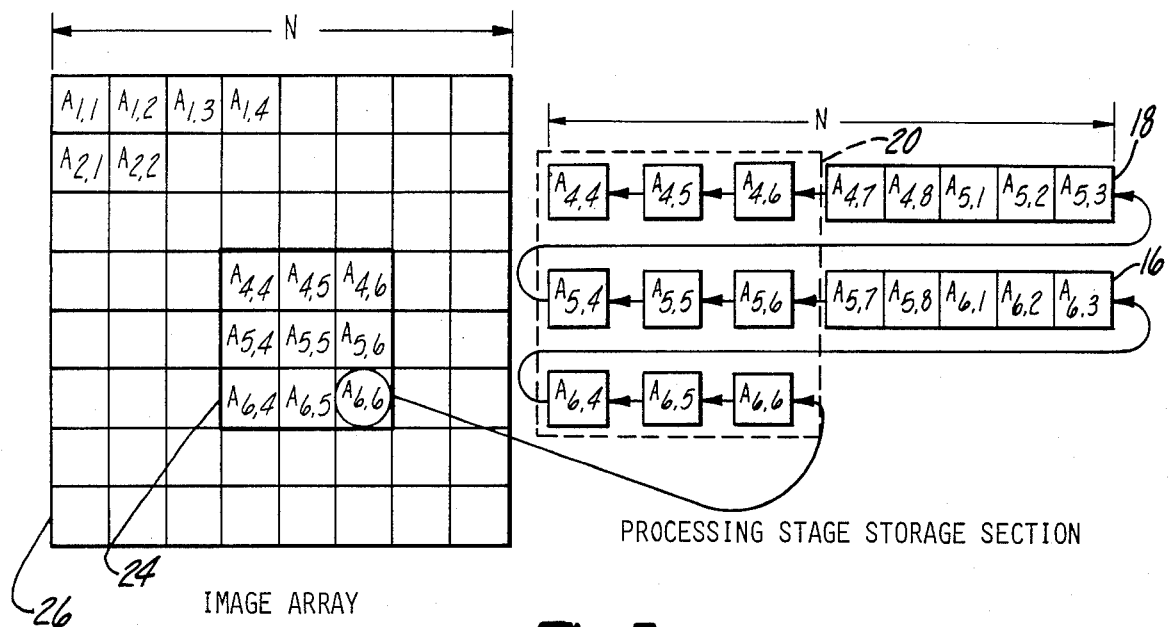
Fig-3
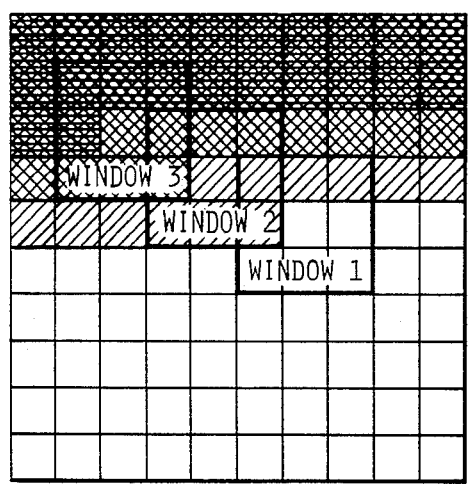
Fig-4

DESIGN RULE CHECKING USING SERIAL NEIGHBORHOOD PROCESSORS

This application is a division, of application Ser. No. 340,609, filed Jan. 19, 1981, now U.S. Pat. No. 4,441,207.

DESCRIPTION

1. Technical Field

This invention relates to automatic inspection systems and, more particularly, to such systems operating upon a matrix of pixel data associated with the thing being inspected.

2. Background Art

It is projected that the semiconductor industry by 1985 will achieve integration levels for very large scale integrated (VLSI) circuits approaching one million devices on a single chip. Even more complex system are anticipated from the very high speed integrated circuits (VHSIC) program now being reported in the literature. Systems of such complexity require computer assisted validation at many stages in the design procedure before the design is finalized for production.

One of the most critical components in the design of integrated circuit devices is the masks which are used in the formation of various regions on the semiconductor wafer. Failure of these masks to abide by prescribed geometrical constraints may lead to improper operation of the integrated circuit device. For example, if the mask controlling application of metal conductors to the wafer permits adjacent lines to become too closely spaced there is the possibility of electrical shorts occuring. Analogously, an improper degree of overlap between polysilicon and diffusion regions may lead to improper MOS transistor operation.

Various design rules have been proposed in an effort to prevent these problems. Design rules are a set of geometrical constraints that the masks of the wafer fabrication process must satisfy. Mead and Conway set forth a series of design rules appropriate for nMOS technology in their book *Introduction To VLSI Systems*, Addison-Wesley, Reading, 1980. Computer systems for checking for compliance with such design rules have been the subject of considerable work in the art. An excellent summary of the state of the art is reported in Baird, "Fast Algorithms for LSI Artwork Analysis", Journal of Design Automation and Fault-Tolerant Computing, Vol. 2, No. 2, May 1978. Generally, known artwork analysis systems are based on the use of a general purpose computer to implement fairly complex algorithms. Applicants are aware that C. M. Baker has proposed design rule checking algorithms which analyze bit-map representations of the IC masks. See, e.g., Baker, "Artwork Analysis Tools for VLSI Circuits", (M.S. Thesis) MIT, 1980; and Baker et al, "Tools For Varifying Integrated Circuit Designs", *Lambda*, 4th Qtr., 1980. However, no admission is made that these papers should be considered prior art.

One of the problems with the prior art approach to computerized design rule checking is the comparatively long processing time required to perform the analyses. For the most part each mask is analyzed separately, with the results returned and stored in a main memory storage device. In order to perform many of the design checks requiring data from more than one mask, such as overlap checking, data associated with each mask must be separately retrieved and analyzed. The use of a general purpose computer, together with the types of memory transfer operations involved, both tend to unduly increase the processing time for performing computerized design rule checking.

The present invention is directed to solving one or more of these problems.

DISCLOSURE OF THE INVENTION

Pursuant to the present invention these design rule checks are performed by a special purpose computer whose architecture is geared to cellular image processing. In particular, a method is employed to perform design rule checks by using neighborhood transformations on bit-map representations of articles such as the IC masks.

Pursuant to the present invention a method is provided for checking bit-map representations of an article for compliance with preselected geometrical constraints. The bit-map is fed in a raster scan line format to an input of a system having at least one serial neighborhood transformation stage. A series of neighborhood transformations are performed in the system to detect regions in a bit-map not complying with said geometrical constraints. An output is generated flagging the detected regions in noncompliance.

One particularly advantageous aspect of this invention enables the user to check plural bit-map representations of related articles. The plural bit-maps are superimposed by combining related bits in each map into a composite matrix of multi-bit pixels. The multi-bit pixels are fed in a raster scan line format to an image processing system having at least one serial neighborhood transformation stage. A series of neighborhood transformations are performed in the system to detect for regions in at least one of the bit-maps not in compliance with the desired geometrical constraints. An output is generated flagging the detected regions in noncompliance.

In the preferred embodiment, a pipeline of programmable serial neighborhood transformation stages are utilized to perform design rule checks on a plurality of IC masks. The bit-map representations of several masks are combined so that they are electronically superimposed with one another to form a composite image matrix which is fed into the pipeline in a raster scan line format. Each pixel in the composite matrix is made up of a plurality of bits. Each bit contains information about one IC mask at a particular point in the same spatial location as the other masks. Each stage includes bit level enabling circuitry for selecting particular bits in each pixel for processing in a given stage. In such manner selected bit-map representations of certain masks are analyzed while the remaining bits of other masks are passed along unmodified to subsequent stages in the pipeline until they are needed for further processing. Quite favorable processing speed advantages are achieved in comparison with general purpose computer artwork analysis systems since all of the necessary mask information is carried along in the pipeline. Thus, the need for relatively large intermediate memory devices for storing the result of each mask analysis is eliminated, as is the lost processing time for loading and unloading data from such memory devices.

BRIEF DESCRIPTION OF THE DRAWINGS

These and other advantages of the present invention will become apparent to one skilled in the art after study of the following specification and by reference to the drawings in which:

FIG. 2 is a block diagram of a serial neighborhood processing system which may be used in performing the design rule checks pursuant to the preferred embodiment of the present invention;

FIG. 3 schematically represents a neighborhood window in an image matrix;

FIG. 4 schematically represents the neighborhood window relationships during execution of transformations in three successive stages in the pipeline.

DESCRIPTION OF THE PREFERRED EMBODIMENT

As noted above, design rules are set of geometrical constraints that integrated circuit masks must satisfy. The present invention will be described in connection with carrying out design rules described in the above-identified publication to Mead and Conway for nMOS IC masks although the present invention finds utility in performing other design rules as well.

The design rules of Mead and Conway are expressed in a dimensionless form as multiples of a basic length unit $\lambda$. In 1981, $\lambda$ is in the range of 1.5 to 2 microns for typical commercial processes.

Basically, the design rules fall into three classes: single mask width and spacing constraints, transistor geometry constraints, and the contact cut constraints. Typically, the IC masks involved are those for diffusion, contact cuts, ion implantation, metal and polysilicon.

Figure 1A:
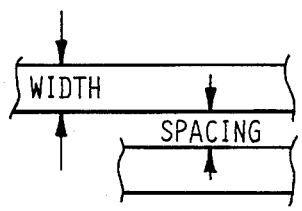
FIG. 1(A-E) is a schematic diagram of a set of design rules for integrated circuit masks.
Figure 1B:
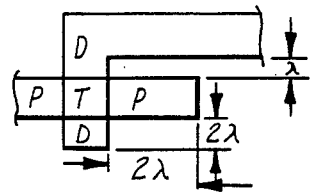
Figure 1C:
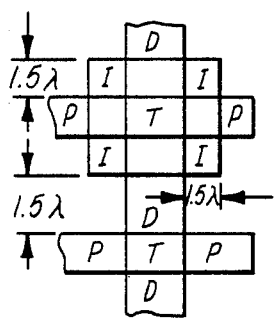
Figure 1D:
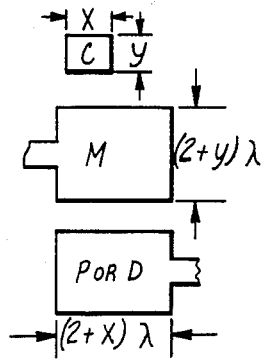
Figure 1E:
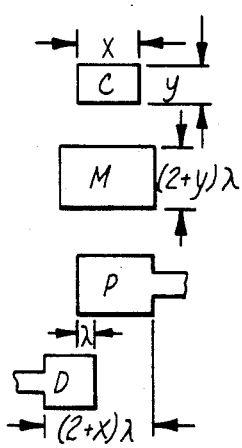

The width and spacing constraints are shown in FIG. 1A. The width of a diffusion region should be no less than $2\lambda$ and the spacing between two diffusion regions should be no less than $3\lambda$. The minimum width and spacing for polysilicon and contact cuts should be $2\lambda$, and the minimum width and spacing for metal should be $3\lambda$.

The transistor geometry constraints are shown in FIGS. 1(B-C). The letter "D" indicates diffusion, "I" indicates ion implantation, "P" indicates polysilicon, and "T" the transistor formed from the polysilicon region crossing the diffusion region. Those skilled in the art will recognize that in an enhancement mode transistor the polysilicon is laid down before the diffusion process occurs and, accordingly, there is essentially no diffusion under the T regions. This region forms a channel in the substrate between the separated regions of diffusion. Conduction in this channel is controlled by the polysilicon gate. It can be seen from FIG. 1B that the minimum distance between a polysilicon region and a diffusion region should be $\lambda$ unless they cross to form a transistor. In this later case both the polysilicon region and the diffusion region should extend at least $2\lambda$ beyond the T region. Conversely, if the transistor is a depletion mode transistor as shown in the upper portion of FIG. 1C, the ion implantation region required for such a device should extend beyond the T region $1.5\lambda$ in all directions. Furthermore, the I region should be separated by at least $1.5\lambda$ from any enhancement mode transistor as shown in the lower portion of FIG. 1C.

Finally, FIGS. 1(D-E) show contact cut constraints with "c" indicating a contact cut. Generally, they are two types of cuts: normal contacts and butting contacts. The constraints for the normal contacts are shown in FIG. 1D and those for butting contacts are shown in FIG. 1E. The normal contacts joins metal to either polysilicon or diffusion. The butting contact joins polysilicon and diffusion with a metal "jumper". The width and spacing requirement for normal contacts were previously described in connection with FIG. 1A. The dimensions "x" and "y" should both be at least $2\lambda$. In addition, the two regions to be joined should overlap the contact cut by at least $\lambda$. In the case of butting contacts the dimension "x" should be at least $4\lambda$, "y" should be at least $2\lambda$, and the union of polysilicon and diffusion regions should overlap the contact cut by at least $\lambda$. These two regions should overlap one another by $\lambda$ under the contact, and the metal "jumper" or cap that joins them should also overlap the contact by at least $\lambda$.

FIG. 2 illustrates a serial neighborhood processing system 10 for checking for adherence to these design rules by operating on bit-map images of the mask layouts. These bit-maps are matrices of binary ones and zeroes. Generally, the binary ones will represent those transparent areas in the mask which define the extent of the regions to be formed on the wafer, such as diffusion, polysilicon, etc. Binary zeroes will represent those points in the mask which are opaque and thus block formation of these regions. Bit-map representation can be provided by a variety of means including state of the art computer aided design (CAD) equipment and the like. Normally, the bit map representations are stored in an external memory which can be read out in a raster scan line format by conventional methods. Pursuant to the present invention, these bit-map representations are checked for compliance with the design rules before the masks are actually made. However, it is possible to obtain bit-map representations of existing masks by conventional TV scanning methods.

In the preferred embodiment, the system 10 consists of a pipeline 12 of substantially identical serial neighborhood transformation stages. The stages are connected to a common clock and each stage in the pipeline performs a single neighborhood transformation of an entire image matrix. Data is entered into the pipeline 12 as a serial stream of eight bit pixels in sequential line scanned format and progresses through the pipeline of processing stages at a constant rate. Following the initial latency to fill the pipeline, each image matrix is analyzed at the same rate as they are entered. Memory devices within each stage are provided to hold two contiguous scan lines. In the embodiment shown in FIG. 2 shift registers 16 and 18 are employed as line delay buffers which cooperate with the window registers to perform this function. Alternatively, the window registers can be sequentially loaded from a random access memory in each stage as disclosed in U.S. Ser. No. 178,313, filed Aug. 15, 1980, to McCubbrey et al, now U.S. Pat. No. 4,395,700 which is hereby incorporated by reference.

An array 20 of neighborhood window registers holds nine neighborhood pixels which constitute a $3 \times 3$ window. The output of the window register array 20 is coupled to a neighborhood logic transformation module 22. Module 22 performs a preprogrammed transformation of the center pixel based on the values of the center pixel and its eight neighbors. Neighborhood logic transformations are computed within the data transfer clock period, allowing the output of a stage to appear at the same rate as its input. At each discrete time interval a new pixel is clocked into the stage and the old pixels are shifted one position.

To visualize the transformation process, imagine a 3×3 window 24 moving across an image matrix 26 as shown in FIG. 3. The window register array 20 is shown in FIG. 3 after the pixel $A_{6,6}$ has been read. The neighborhood transformation module 22 computes the transformed value of the pixel in the center window register as a function of its value and the value of its surrounding neighbors. The transformed output value of the center pixel is then output from the stage and connected to the input of the next stage. From this example, it can be realized that the latency of a stage is equal to N+2 time steps, N being the line length. FIG. 4 illustrates a series of three 3×3 stage windows following each other across the image matrix, each of the three stages processing the previous stage's output.

Referring back to FIG. 2, each stage further includes point-by-point logic circuitry 28 for performing operations which do not depend upon the values of neighboring pixels. For example, point-by-point logic circuitry 28 may perform such things as scaling, ANDing or ORing together selected bits in the pixels, or other Boolean functions. In such manner, the point-by-point logic circuitry 28 may simplify the design of the module 22. Further details of the construction of the image processor system 10 are disclosed in the aforementioned U.S. Pat. No. 4,395,700 as well as in U.S. Pat. Nos. 4,167,728 and 4,301,443 which are also hereby incorporated by reference.

Pursuant to one aspect of the present invention the bit-map representations of all of the IC masks are combined and fed simultaneously in a raster scan line format through pipeline 12 for processing. It will be remembered that system 10 is capable of operating on eight bit pixel data, i.e. each pixel location may contain eight bits of information. In the present invention system 10 is designed to operate on eight separate binary images in parallel, rather than one image of eight bit pixels. The binary images or bit-maps of the contact cut, diffusion, implant, metal and polysilicon masks are denoted as C, D, I, M, and P, respectively in FIG. 2. The bit-maps of the masks are superimposed by combining bits of corresponding spatial location into a composite matrix of multibit pixels. In other words, with reference to FIG. 3, the bit associated with the spatial location $A_{1,1}$ of the contact cut mask C will occupy bit position 1 in the eight bit wide pixel, with the bits associated with location $A_{1,1}$ of the diffusion, polysilicon, implant, and metal masks occupying bit positions 2, 3, 4 and 5, respectively. Accordingly, binary pixels from each of these mask images occupy five of the eight bits in the system's data path. The remaining three bits are used as temporary variables for the intermediate results that occur when the neighborhood logic module 22 applies a transformation to an image or when the point-by-point logic module 28 performs a bit-wise logical operation between images. The extra bits will be referred to as temporary bit-maps T1, T2 and T3.

Each stage in the pipeline 12 further includes bit level enable circuitry 30 within module 22 for selecting one or more of the bit-maps for analysis in a given stage. The bits associated with the other bit-maps pass through the stage unmodified. For example, stage 1 may be programmed to perform a particular neighborhood transformation on the polysilicon bit-map in which case the bit associated with the polysilicon mask will be enabled for processing by the neighborhood logic module 22, with the other bits in the pixel being effectively ignored. More than one bit can be enabled when, for example, doing a Boolean AND function between the bits of two masks by the point-by-point logic circuitry 28. The programming of each stage, including the selection of the particular bits to be enabled, is accomplished by way of a master controller 32 communicating with each stage. The details of a satisfactory bit level enable circuit are disclosed in above-identified U.S. Pat. No. 4,301,443.

Some of the more useful neighborhood transformations carried out by the stages in the pipeline 12 are erosion and dilation functions, also known in the art as shrinking and expanding functions. For ease of reference, the neighborhood window registers in array 20 are labeled with the points of the compass: N, NE, SE, S, SW, W, NW, Center. The result of a neighborhood transformation, F, is a binary value given by F(neighborhood set). The following transforms are useful in performing design rule checks:

$F_1$ = N·NE . . . Center
$F_2$ = N·Center
$F_3$ = E·Center
$F_4$ = S·Center
$F_5$ = W·Center where the transform $F_x$ is the Boolean AND of all the noted neighbor pixels.

For example, transform $F_3$ will provide a transformed output value of binary 1 if the center cell and the eastern cell in the window register 20 array are binary ones, otherwise the transformed output value would be a binary zero. Additional useful transformations are $G_1$, $G_2$, ... $G_5$. They are the duals of $F_1$, $F_2$ ... $F_5$, respectively. For example, transformation function $G_3$ would provide a transformation output value of one if the center cell or the eastern cell is a binary one.

Using these neighborhood transforms the stages in the pipeline can function to transform complete bit-map images into transformed bit-map images. Example of erosions of a bit-map image A are:

ERODE[A]: apply $F_1$ to every pixel in image A
ERODE-NORTH[A]: apply $F_2$ to every pixel in image A
ERODE-EAST[A]: apply $F_3$ to every pixel in image A Similarly, for ERODE-SOUTH and ERODE-WEST. The term ERODE, as the name suggests, can be thought as a transformation that shrinks regions of binary ones in the bit-map by one pixel. The function ERODE shrinks one pixel in all directions, the function "ERODE-NORTH" shrinks one pixel in a northerly direction only, the function "ERODE-EAST" shrinks one pixel in an easterly direction, etc.

Analogously, the stages in the pipeline can be programmed to perform dilation functions on a bit-map image A as follows:

DILATE[A]: apply $G_1$ to every pixel in image A
DILATE-NORTH[A]: apply $G_2$ to every pixel in image A
DILATE-EAST[A]: apply $G_3$ to every pixel in image A Similarly, for DILATE-SOUTH and DILATE-WEST. The term "DILATE", as the name suggests, can be thought as a transformation that expands regions of binary ones in the bit-map by one pixel. The function "DILATE" expands one pixel in all directions, the function "DILATE-NORTH" expands one pixel in the northerly direction only, the function "DILATE-EAST" expands one pixel in the easterly direction, etc.

The design rules noted above can be checked by successive application of these transformations (carried out by the neighborhood transformation logic module 22 in each stage) together with bit-wise Boolean operations (carried out by the point-by-point logic circuitry 28 in each stage). To illustrate this capability, some of the width checks for 2λ for polysilicon regions and the 2λ overlap check for polysilicon adjacent to a transistor area will be described in detail below.

According to the preferred embodiment, the superimposed bit-maps are all fed into the bus 14 of the pipeline 12. The first group of stages, however, are programmed to analyze the polysilicon bit-map only. Accordingly, the bit level enable circuitry within 22 of these stages is programmed to select the bits in each pixel associated with the polysilicon mask and pass bits associated with the other masks along through the pipeline unmodified until they are needed. In fact, the enabled bits of the mask being analyzed are also carried down the pipeline unmodified since the transformed image result will be stored in one of the temporary bit-maps T1, T2, T3 as will appear herein.

The following method checks the polysilicon or P bit-map for some regions of binary ones (indicating the presence of polysilicon) that are less than 2λ in width. Such regions are flagged by placing binary ones in the bits associated with the temporary bit map T1. The IC masks are assumed to be drawn on a ½λ based grid. Therefore, each image pixel represents a ½λ square region of a mask. Thus, the width check corresponds to detecting regions that cannot contain a horizontal or vertical line of four binary ones.

In this example, the method of performing the width check can be summarized by the following table:

TABLE I (1) T1:=ERODE-EAST[P]
(2) T1:=ERODE-SOUTH[T1]
(3) T1:=ERODE[T1]
(4) T1:=DILATE[T1]
(5) T1:=DILATE-SOUTH[T1]
(6) T1:=DILATE-EAST[T1]
(7) T1:=EXOR[T1,P]

Figure 5A:
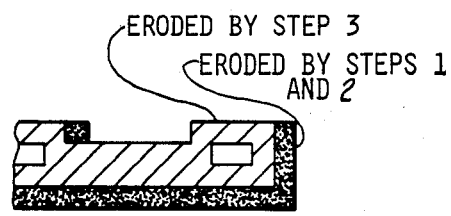
FIG. 5(A-B) pictorially illustrates the results of neighborhood transformations carried out by the system on a given mask.
Figure 5B:
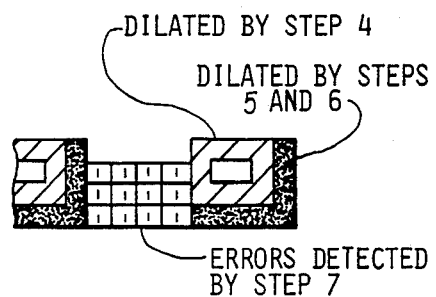

The seven steps are diagrammed in FIG. 5 where the outline in FIG. 5A illustrates a region of binary ones in the polysilicon bit-map. The first two steps in the method shrink the region by one pixel along any of its easterly and southerly borders. The third step shrinks the resultant transformed image (stored in variable bit-map T1) by one pixel in all directions. Thus, most regions of binary ones which are less than or equal to three pixels in width will be removed. The remaining islands are centrally located in regions containing greater than three pixels. These islands are dilated in step 4, one pixel in all directions, with steps 5 and 6 causing dilation in the southerly and easterly directions as can be seen in FIG. 5B. Effectively, the method employs a sufficient number of erosion steps to remove all regions having a width less than that associated with a given number of pixels and then dilating the remaining portions of the transformed matrix by the converse of the erosion steps. This will create a transformed image which is exactly the same as the original image except that those regions less than the prescribed width are removed.

The last step is to perform an exclusive-OR function between the transformed image T1 and the original polysilicon bit-map image P. This will flag those areas of less than a given width (here 2λ) in the polysilicon bit-map. It should be noticed that the first six steps are neighborhood transformations which are carried out by the neighborhood transformation logic module 22 whereas the last step is a bit-wise exclusive-OR function performed by the point by point logic 28. Each step in the method can be carried out by separate stages in the pipeline. However, some of the steps can be combined into one stage. For example, the ERODE-EAST and ERODE-SOUTH steps can be performed in one stage as can be the DILATE-SOUTH and DILATE-EAST steps.

The composite image matrix may continue on down the pipeline to perform other design rule checks. For example, the following table illustrates a sequence of steps for checking for polysilicon overlap of at least 2λ in the area of a transistor:

TABLE II (1) T2:=AND[P,D]
(2) T3:=EXOR[P,T2]
(3) T3:=flags from a width test of 2λ on T3
(4) T1:=OR[T1,T3]

The next stage in the pipeline performs step 1 by using the bit levels associated with the polysilicon and diffusion bit-maps, with the point-by-point logic circuitry 28 performing a logical AND function between the polysilicon and diffusion bit-map images. The results of this operation is passed on to the next stage in temporary bit-map T2. The next stage examines those bits associated with the polysilicon bit-map and the computed temporary bit-map T2. The circuitry 28 performs an exclusive-OR function on the two images. This removes the gate area from the polysilicon bit-map. The computed bit-map is stored in image T3 and passed along to the next stage. Thus, T3 now contains the polysilicon bit-map with the gate areas removed. Now the next stages in the pipeline perform the same width check described in Table I on the image T3. This will detect those regions of polysilicon which are less than 2λ in the neighborhood of a transistor. Those areas will be flagged by binary ones. It will be remembered that temporary bit-map T1 contains flags for errors during the overall width check. By doing an OR function in the point-by-point logic 28 of the next stage any additional errors detected by the overlap check can be accumulated in image T1.

Similar techniques to those presented in the above two examples allow the checking of all of the design rules outlined above. For example, spacing checks can be performed as width checks on the bit-wise complement of the mask image.

The use of serial neighborhood processing techniques to perform design rule checking has proven to be almost two orders of magnitude faster than an artwork analysis program run on a general purpose computer. Those skilled in the art can appreciate that by using a pipeline of programmable serial neighborhood transformation stages with multi-bit capabilities that all of the necessary information to perform intermask checks as well as intramask checks is already present in the pipeline and can be readily accessed. This is especially advantageous in those design rule checks in which information about two or more masks is necessary such as when performing the overlap check noted above. There is no need to analyze certain portions of the artwork, store it, and later retrieve it for performing subsequent checks.

The described serial neighborhood processing approach further provides advantages over an implementation such as a two dimensional parallel array of processors. In such an array, one processor exists for each pixel in the image. These processors operate to transform the entire image substantially at the same time. However, these parallel array processors are extremely costly to implement in light of the limitations of present fabrication and packaging technology.

While the present invention has been described in connection with performing design rule checks on IC masks, it would also find utility in checking for adherence to geometrical constraints on bit-map representations of other articles such as printed circuit board artwork and the like. The superimposition of different but spatially related masks in the processing approach described above considerably aids in this type of artwork analyses. In fact, on-line printed circuit board inspection systems using TV raster scan detection techniques to sense both sides of a printed circuit board would be particularly suited for implementation by the serial neighborhood processing approach described herein.

Also, it is possible to perform neighborhood transformations of the type noted above in a single serial neighborhood transformation stage where the output of the stage is fed back to its input through a high speed memory device. While this would decrease system costs somewhat, it would also necessarily lead to an increase in processing times.

Other modifications of the present invention will become apparent to one skilled in the art after a study of the drawings, specification, and following claims.

We claim:

1. A method of checking bit-map representations of an article for compliance with preselected geometrical constraints, said method comprising:

feeding said bit-map representations in a raster scan line format to an input of a system having at least one serial neighborhood transformation stage;
   performing a series of neighborhood transformations in said system to detect regions in the bit-map not complying with said geometrical constraints; and
   generating an output of the system flagging said detected regions in noncompliance.

2. A method of checking plural bit-map representations each associated with one of a plurality of related articles for compliance with preselected geometrical constraints, said method comprising:

superimposing said plural bit-map representations by combining bits of corresponding spatial location into a composite matrix of multi-bit pixels;
   feeding said pixels in a raster scan line format to an image processing system having at least one serial neighborhood transformation stage;
   performing a series of neighborhood transformations in said system to detect for regions in at least one of the bit-maps not in compliance with said geometrical constraints; and
   generating an output of the system flagging said detected regions in noncompliance.

3. A method of checking plural bit-map representations, each associated with one of a plurality of related articles for compliance with preselected geometrical constraints, said method comprising:

arranging the plural bit-map representations according to a predetermined relationship;
   combining bits of corresponding position in the bit-map representations into a composite matrix of multi-bit pixels;
   feeding said pixels in a raster scan line format to an image processing system having at least one serial neighborhood transformation stage;
   performing a series of neighborhood transformations in said system to detect for regions in at least one of the bit-maps not in compliance with said geometrical constraints; and
   generating an output of the system flagging detected regions in noncompliance.

* * * * *